United States Patent [19]

Belke, Jr. et al.

[11] Patent Number: 5,783,008
[45] Date of Patent: Jul. 21, 1998

[54] APPARATUS AND METHOD FOR EMBEDDING CONDUCTORS IN A NON-PLANAR SUBSTRATE

[75] Inventors: Robert Edward Belke, Jr., W. Bloomfield; Robert Bush, Rochester Hills; Brian Daugherty, Ann Arbor; Paul James Mardeusz, Dearborn Heights; John Trublowski, Troy, all of Mich.

[73] Assignee: Ford Global Technologies, Inc., Dearborn, Mich.

[21] Appl. No.: 829,393

[22] Filed: Mar. 31, 1997

[51] Int. Cl.[6] .................................................. B32B 31/16
[52] U.S. Cl. .................... 156/73.2; 156/73.1; 156/298; 156/303.1; 156/538; 156/580.1
[58] Field of Search ................... 156/64, 73.1, 73.2, 156/297, 298, 303.1, 361, 362, 538, 539, 580.1, 580.2

[56] References Cited

U.S. PATENT DOCUMENTS

| | | | |
|---|---|---|---|
| 3,505,726 | 4/1970 | Kleinedler et al. | 228/110.1 |
| 3,674,914 | 7/1972 | Burr | 174/68.5 |
| 4,028,798 | 6/1977 | Bechard et al. | 156/73.2 X |
| 4,591,087 | 5/1986 | Frasch | 228/110.1 |
| 4,619,397 | 10/1986 | Urban | 228/111 |
| 4,641,773 | 2/1987 | Morino et al. | 156/580.1 |
| 4,818,322 | 4/1989 | Morino et al. | 156/272.8 |
| 4,944,087 | 7/1990 | Landi | 29/848 |
| 4,975,133 | 12/1990 | Gochermann | 156/73.1 |
| 5,186,776 | 2/1993 | Boyce et al. | 156/73.2 |
| 5,495,976 | 3/1996 | Mironesco et al. | 228/110.1 |

*Primary Examiner*—James Sells
*Attorney, Agent, or Firm*—Raymond L. Coppiellie

[57] ABSTRACT

An apparatus and a method for embedding conductors in a structure having a signal distribution function associated therewith such as a vehicle instrument panel are disclosed. The apparatus includes an embedding tool which can be positioned in three dimensional space to embed conductors in non-planar surfaces. A method for such embedding is also disclosed.

9 Claims, 3 Drawing Sheets

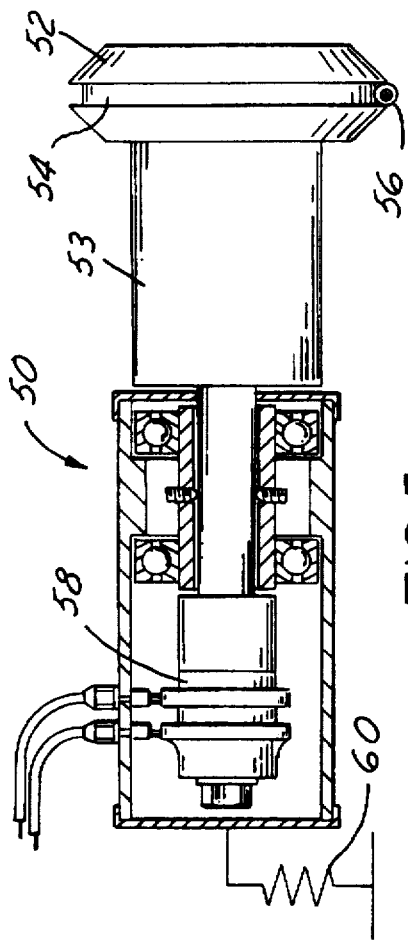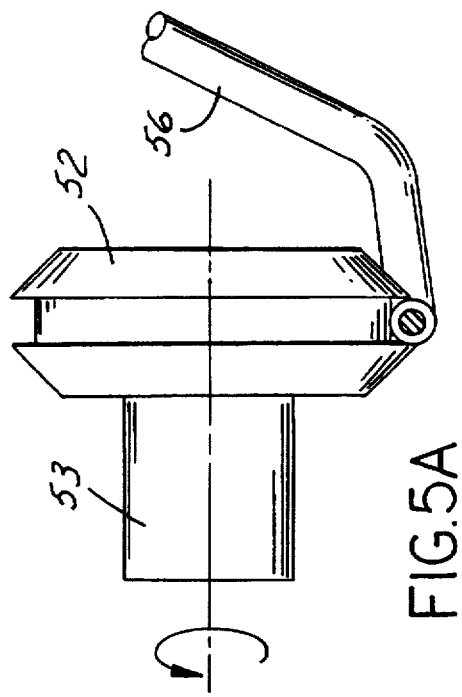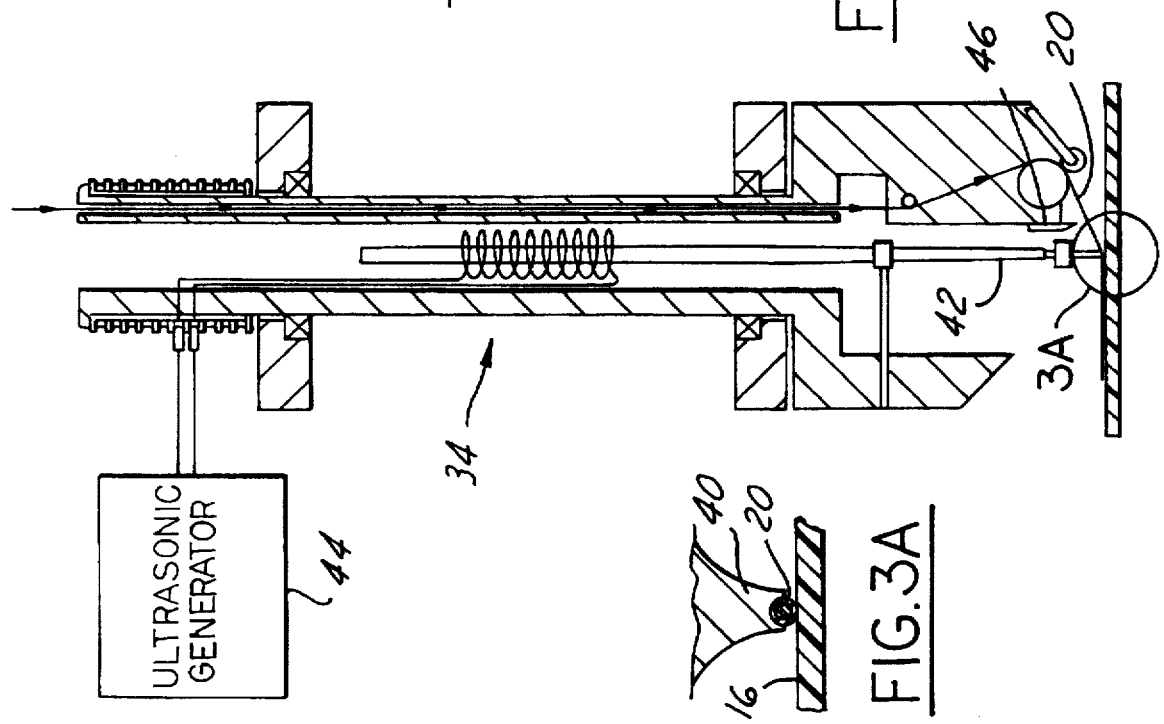

APPARATUS AND METHOD FOR EMBEDDING CONDUCTORS IN A NON-PLANAR SUBSTRATE

BACKGROUND OF THE INVENTION

1. Field of the Invention

The present invention relates to an apparatus and a method for embedding conductors in a non-planar material in a structure, such as a vehicle instrument panel or the like.

2. Disclosure Information

Typically, a vehicle instrument panel assembly includes multiple wire harnesses providing electrical communication for various electronic instrument panel components such as a sound system, anti-lock brake module, engine control module, air bag module, as well as many other components. As is readily apparent, this assembly can consume a substantial amount of space beneath the instrument panel.

It is, therefore, desirable to provide a method and structure for integrating such wire harnesses or other electrical conductors and/or connectors in a vehicle instrument panel or other large vehicle interior subsystems having signal or power distribution applications. Such a method and structure would permit more efficient use of vehicle space while also improving manufacturing time and costs, as well as product performance. Ideally, such a method and structure would also be environmentally robust with rapid, cost effective and robust means for establishing electrical connections associated therewith.

In that regard, various techniques for attaching, molding and embedding electrical conductors and/or components to planar substrates are known in the art. For example, a known method of inscribing conductive traces into circuit boards is to ultrasonically embed them into the adhesive layer forming the inner layer wiring of the circuit board. Such a system is described in U.S. Pat. No. 3,674,914, wherein an ultrasonic embedding tool is used to embed conductive traces. The system of the '914 patent teaches embedding the traces onto a generally flat, planar circuit board. The '914 system uses an ultrasonic embedding tip which softens the substrate. To be most efficient, the ultrasonic tip must be held perpendicular to the substrate. If the tip is not held perpendicular to the substrate, the efficiency of the applied energy is lost and minimal or no embedding takes place.

However, with the advent of innovative packaging, especially in the automotive field, the use of planar substrates is decreasing in favor of three dimension, non-planar configurations. An example of such an application is a plenum of an air conditioning system. Wire harnesses are typically secured or joined to the plenum. These harnesses could be replaced if conductors could be directly integrated into the plenum. The plenum substrate is non-planar so as to conform to the instrument panel packaging requirements. The method of the '914 patent described above teaches only embedding conductive traces in a planar surface and fails to teach any method for embedding conductors into non-planar substrates. The method of the '914 patent cannot embed conductors in a non-planar surface because the tool described therein can only be oriented vertically and perpendicularly to a planar surface. To provide for the most efficient use of the highly localized ultrasonic energy, the bonding tip must be kept perpendicular to the substrate at all points where embedding is to occur, even points on the surface of a non-planar substrate. There is no teaching in the '914 patent of a method or apparatus to orient the tool to maintain a generally perpendicular relationship with a three dimensional, nonplanar substrate.

Therefore, it would be desirable to provide a method for embedding conductors into non-planar substrates.

SUMMARY OF THE INVENTION

Accordingly, it is the principle object of the present invention to provide an apparatus and method for embedding conductors in a non-planar structure having an arcuate cross-section such as a vehicle instrument panel or other large vehicle interior subsystems having signal distribution applications. The apparatus comprises a multi-positionable embedding head movable in three dimensional space having an ultrasonic tool with an embedding tip at one end thereof, the embedding head being positionable such that the embedding tip is disposed at an angle of between 45 and 90 degrees to a line tangent to the surface of the non-planar substrate at a point at which the embedding tip contacts said surface. The apparatus further comprises a conductor feed device operatively associated with the embedding head and a controller connected to the multi-positionable embedding head for providing positioning signals thereto.

The method of the present invention includes the steps of providing a wire embedding head and positioning the head in three dimensions to maintain an angle of between 45 and 90 degrees to a line tangent to the substrate surface at the point at which embedding is to occur. The method comprises the further steps of contacting an ultrasonic stylus in the embedding head against the wire and creating ultrasonic vibrations transmitted through the wire to soften the substrate. The conductor is then pressed into the softened substrate which is then allowed to cool and harden, locking the conductor into place.

Another object of the present invention is to provide an article, such as a vehicle instrument panel or other large vehicle interior subsystems having signal distribution applications, produced in accordance with the method for embedding conductors in a structure.

An advantage of the present invention is that fast design changes can be easily made, and repairing and modifying of 3-D circuitry can be easily accomplished. It is a further advantage of the present invention that rapid prototype processing for wire harness-like applications can be completed more quickly than heretofore.

These and other objects, features and advantages will be readily apparent upon consideration of the following detailed description in conjunction with the accompanying drawings.

BRIEF DESCRIPTION OF THE DRAWINGS

FIG. 3 is a cross-sectional view of an ultrasonic embedding apparatus for embedding conductors into a substrate.

FIG. 3A is an enlarged view of a portion of FIG. 3.

FIGS. 5 and 5A are perspective views of an alternative apparatus for embedding conductors in non-planar substrates in accord with the principles of the present invention.

DETAILED DESCRIPTION OF THE PREFERRED EMBODIMENTS

Figure 1:
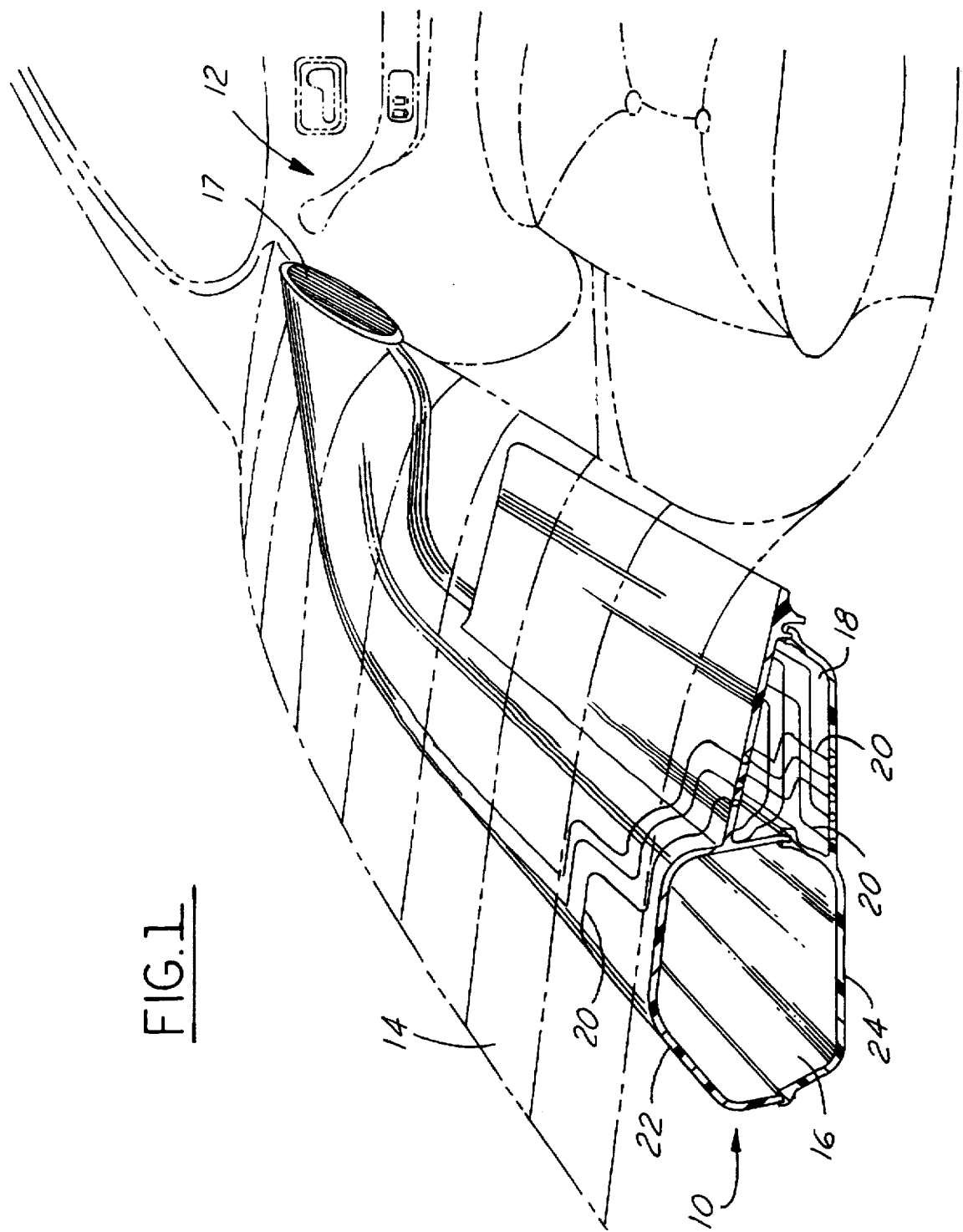
FIG. 1 is a perspective, partially cut away view of a ventilation duct for an automotive vehicle having conductors embedded therein in accord with the principles of the present invention.

With reference to the drawings, FIG. 1 shows an apparatus 10 for conveying air to the passenger compartment of a vehicle 12 disposed beneath the vehicle instrument panel cover 14. As shown in FIG. 1, the apparatus 10 is a ventilation duct 16 incorporating a parallel housing 18 which can serve multiple purposes. As shown, the housing 18 includes a plurality of conductors 20, such as wires, which replace conventional wire harnesses. The duct 16 comprises first and second molded mating shell portions 22, 24. The shell portions are non-planar; that is, they each have an arcuate cross-section. The ventilation duct 16 includes a vent register 17 at the end thereof for communication with the passenger compartment of the vehicle. The present invention will be described with reference to its applicability to the described ventilation duct, but the present invention is not meant to be limited to such application. As will become apparent from the following description, the present invention can be used to embed conductors in a variety of non-planar substrates.

As seen in FIG. 1, a plurality of conductors 20 are embedded into the substrate of the duct 16. In that regard, as used herein, the term embedded is not intended to be defined as completely within. Rather, embedded is defined herein as at least partially within. Conductors 20 are preferably insulated wires, but other types of conductors may also be used including bare wires, metal strands or optical fibers. Furthermore, the conductors 20 could be a wire having an integral adhesive (such as a hot melt) which is preapplied and activated upon bonding. Conductors 20 may be of any pattern, including simply multiple parallel conductors such as in a wire harness.

The ventilation duct 16 is a molded part, preferably injection molded, such as by blow molding or low pressure molding. However, duct 16 may also be formed by other molding processes well known in the art including, but not limited to, transfer molding, compression molding, lamination, vacuum autoclaving, and co-extrusion. It is apparent that the molded part, such as duct 16 can be molded with non-planar surfaces and still include embedded conductors 20 as will be described below. The material chosen for the duct 16 (or other molded parts) is preferably a polymer such as a thermoplastic resin, although other types of materials may be used as well. The thermoplastic resin used for duct 16 may be modified with a filler.

Similarly, while the location for conductors 20 in duct 16 described above is preferable, it should be noted that conductors 20 may be located anywhere on or in duct 16, including on the surface 16 or within the interior. In that regard, conductors 20 need not be proximate surface 16, nor run parallel to surface. The only requirement concerning the location of conductors 20 is that some portion thereof be located close enough to a surface of a molded part so that external communication may be established therewith.

Figure 2:
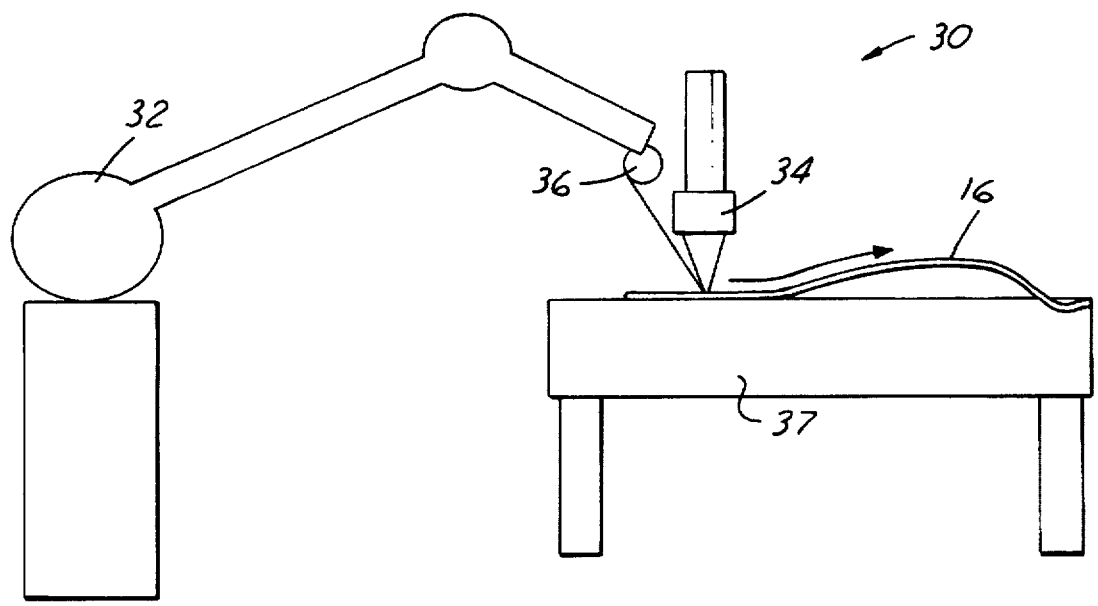
FIG. 2 is a schematic representation of an apparatus for embedding conductors in a non-planar substrate in accord with the principles of the present invention.

FIG. 2 shows an apparatus 30 for embedding conductors 20 into the substrate of the ventilation duct 16 according to the present invention. The apparatus 30 includes a multi-axis robot 32 having an embedding head 34 and a conductor feed device 36 secured to one end thereof. A table 37 or other support member, such as a conveyor assembly carries the duct 16 to the embedding head.

The multi-axis robot 32 moves the embedding head 34 to any position on the duct 16 according to preset locations of the conductors 20. The robot 32 also orients the embedding head 34 such that it maintains a generally perpendicular orientation to the surface of the duct 16. To achieve proper embedding depth, the embedding head must be held between 45 and 90 degrees to a line that is tangent to a point on the surface of the duct 16, the point being that location at which the conductor is to be embedded. No other prior embedding techniques provide for embedding conductors in non-planar substrates. The robot 32 is a six-axis robot such as the Model RX 90 manufactured by Staubli Company. The three dimensional surface of the duct 16 (or other molded part) is mapped into the memory of the robotic control system by teaching the control system the locations where embedding is to occur or by an interpolation program supplied with the control system.

FIGS. 3 and 3A show a cross-sectional view of the embedding head 34 used to embed the conductors 20 into the non-planar substrate. The embedding head 34 includes an ultrasonic stylus 42 having a grooved tip 40 at the end thereof. The conductor 20, such as wire, is delivered to the substrate by a feed device or spool 36. On the surface of the substrate, the wire 20 passes underneath the grooved tip 40 of the ultrasonic stylus 42. An ultrasonic generator 44 creates ultrasonic vibrations in the stylus 42 which in turn create heat which melts the substrate surface under the wire. Downward force on the stylus pushes the wire 20 into the softened surface of the substrate, thus embedding it at least partially. The softened substrate quickly hardens as the stylus 42 is moved by the robot 32, locking the wire into the substrate. Patterns can be formed in the substrate according to the programmed requirements. At the end of the path, the wire 20 is cut by a shear 46 near the stylus tip.

Figure 4:
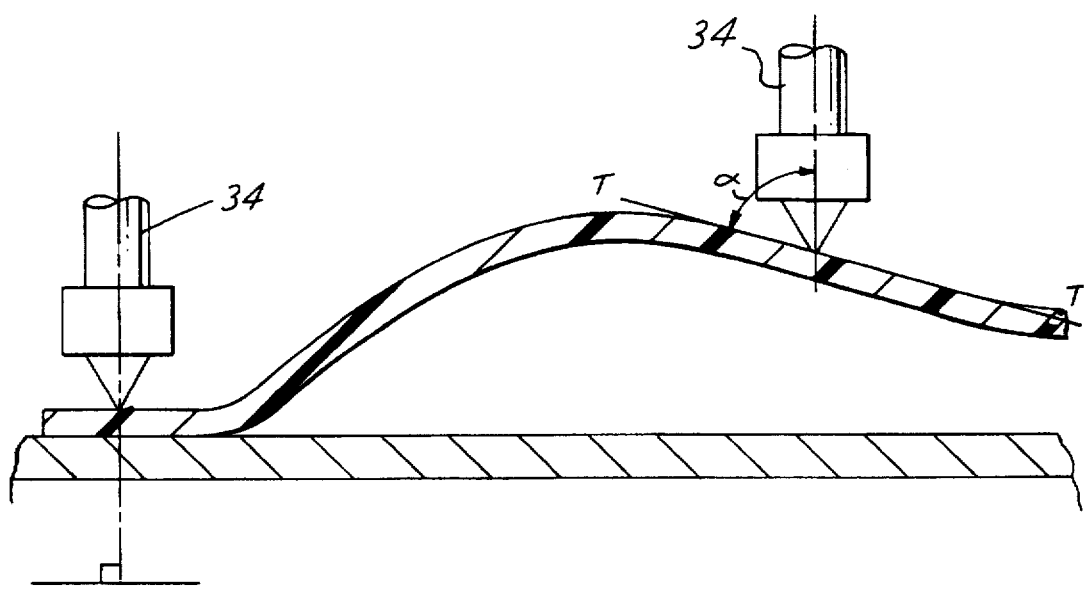
FIG. 4 is a schematic view of an apparatus for embedding conductors in a non-planar substrate.

As shown in FIG. 4, utilizing a robot having six-degree-of-freedom orientation allows the embedding head to be oriented generally perpendicularly to the surface of the substrate. As the embedding head 34 moves along the surface of the substrate, it is oriented by the controller to maintain a normal orientation within 45 degrees to the surface of the substrate at any point therealong. FIG. 4 shows a line T—T drawn tangent to the substrate surface a particular point at which embedding of a conductor is to occur. The stylus of the embedding head 34 is maintained at an angle, α, of between 45 and 90 degrees to tangent line T—T. By employing the robot, or utilizing an end effector having six-degree-of-freedom movement secured to a robot, such an orientation can be maintained.

FIGS. 5 and 5A show an alternative embodiment ultrasonic embedding head. The head 50 includes a rotatable stylus 52 having a groove 54 for receiving the conductor 56 to be embedded. The rotatable stylus 52 is connected via axle 53 to the embedding head 50. The embedding head 50 includes an ultrasonic generator 58, similar to that described above. The generator 58 causes ultrasonic vibrations to occur in the tip, creating heat which softens the substrate. The rotating stylus 52 rolls along the surface of the substrate, pushing down on the conductor by action of a spring 60. An end effector secured to a robotic arm moves the head 50 to the correct position and the wire is embedded by the rotating stylus. Correct orientation is always maintained since the stylus rotates on the surface of the substrate.

Although briefly explained above, the method of the present invention will be further described herein. The method includes the steps of providing a wire embedding head, such as that shown in FIGS. 3 or 5 and positioning the head in three dimensions to maintain an angle of between 45 and 90 degrees to a tangent line through the point at which embedding is to occur. The method comprises the further steps of contacting an ultrasonic stylus in the embedding head against the wire and creating ultrasonic vibrations to soften the substrate. The conductor is then pressed into the softened substrate which is then allowed to cool and harden, locking the conductor into place. It is important to note that the stylus is in constant electrical communication with the wire to be embedded along its total length. This requires that the end effector be movable continuously along the wire, as opposed to end effectors utilized in other technologies wherein the end effector moves from one point to a distant second, without constant communication with the workpiece.

It should also be noted that the materials used according to the method and structure of the present invention require material characteristics which meet various electrical/ electronic specifications concerning manufacturing and operational environments. More specifically, the materials must exhibit adequate physical, thermal, environmental, and electrical properties to meet the requirements of the intended application.

Structures produced according to the method of the present invention permit functions traditionally provided using many separate components such as wire harnesses and/or other conductors and/or connectors to be combined with each other and a vehicle instrument panel or another large vehicle interior subsystem having signal distribution applications to form a single integrated component. Because of the various designs three-dimensional molded circuitry can take, circuitry and interconnections become integrated into the subsystem assembly infrastructure. Thus, designers can integrate circuitry with plastics to reduce cost, size and parts count, while increasing reliability and facilitating manufacturability.

The reduction of individual parts requiring assembly/ disassembly and interconnection also increases reliability and serviceability in the field and lowers manufacturing cycle time. Structures produced according to the method of the present invention also provide for to improved recyclability, requiring fewer process steps and resulting in more recoverable materials. Metal content can be easily stripped by wet chemical or cryogenic processing and separated for reclamation. Remaining polymers are generally 100% recyclable.

As is readily apparent from the foregoing detailed description, the present invention provides a method for embedding conductors in a structure such as a vehicle instrument panel or other large vehicle interior subsystems having signal distribution applications. Still further, the present invention also provides an article, such as a vehicle instrument panel or other large vehicle interior subsystems having signal distribution applications, produced in accordance with the method of the present invention for embedding electrical conductors in a structure.

It is to be understood that the present invention has been described in an illustrative manner and that the terminology which has been used is intended to be in the nature of words of description rather than of limitation. As those of ordinary skill in the art will recognize, many modifications and variations of the present invention are possible in light of the above teachings. For example, the present invention can be utilized in nonautomotive areas as well as for circuit repair. The present invention can be used to make dynamic or "on-the-fly" design changes such as rerouting of electrical connections. Therefore, it is also to be understood that, within the scope of the following claims, the invention may be practiced other than as specifically described above.

What is claimed is:

1. A method for embedding conductors in a structure having a non-planar surface with an arcuate cross-section, such as a vehicle instrument panel, the method comprising the steps of:

providing an apparatus having a six-degree-of-freedom conductor embedding head positionable in three dimensions, the conductor embedding head having an ultrasonic stylus at one end thereof;

providing a conductor feeder;

positioning the conductor embedding head at an angle of between 45 and 90 degrees to a line tangent to the non-planar substrate surface at the point at which said stylus contacts said surface;

laying a length of conductor on the surface of said non-planar substrate;

contacting the stylus against the conductor in the substrate surface and ultrasonically vibrating the stylus to soften the surface of the substrate;

pressing a length of conductor into the softened substrate; and curing the softened substrate to embed the conductor therein.

2. An apparatus for embedding conductors into a substrate having a non-planar surface with an arcuate cross-section, comprising:

a multi-positionable, six-degree-of-freedom embedding head movable in three dimensional space having an ultrasonic tool with an embedding tip at one end thereof, said embedding head being positionable such that said embedding tip is disposed at an angle of between 45 and 90 degrees to a line tangent to the surface of said non-planar substrate at a point at which said embedding tip contacts said surface;

a conductor feed device operatively associated with said conductor embedding head; and a controller connected to said multi-positionable embedding head for providing positioning signals thereto.

3. An apparatus according to claim 1, further including a multi-axis end effector connected to said embedding head for positioning said embedding head perpendicularly to said tangent line of a point at which said embedding tip contacts the surface of said substrate.

4. An apparatus according to claim 2, wherein said embedding head is positionable at an angle of 90 degrees to said line tangent to the surface of said non-planar substrate at the point at which the embedding tip contacts said surface.

5. An apparatus according to claim 2, wherein said embedding tip is operative to produce ultrasonic vibrations to soften said substrate and wherein said conductor feeder is operative to place a length of conductor into said softened substrate.

6. An apparatus according to claim 2, wherein said multi-positionable embedding head comprises a rotatable roller having a circumferential groove therearound, said embedding head being positionable perpendicular to a line tangent to the surface of said non-planar substrate at a point at which said roller contacts said non-planar surface.

7. An apparatus according to claim 6, wherein said roller is rotatably secured to a multi-positionable axle extending from an ultrasonic embedding tool.

8. An apparatus according to claim 7, wherein said multi-positionable axle includes a spring for imparting a controlled force on said roller against said substrate.

9. An apparatus for embedding conductors into a substrate having a non-planar surface with an arcuate cross-section, comprising:

a multi-axis, six-degree-of-freedom end effector;

a multi-positionable embedding head secured to said multi-axis end effector, said embedding head being movable in three dimensional space and having an ultrasonic stylus at one end thereof, said embedding head being positionable such that said ultrasonic stylus is perpendicular to a line tangent to the surface of said non-planar substrate at a point at which said stylus contacts said surface;

a conductor feed device operatively associated with said conductor embedding head; and a controller electrically connected to said multi-axes end effector for providing positioning signals to said positionable embedding head.

* * * * *